United States Patent [19]

Nakao et al.

[11] Patent Number: 5,089,987
[45] Date of Patent: Feb. 18, 1992

[54] REFRESH CONTROL CIRCUIT

[75] Inventors: Yuichi Nakao; Hideharu Toyomoto, both of Itami, Japan

[73] Assignee: Mitsubishi Denki Kabushiki Kaisha, Tokyo, Japan

[21] Appl. No.: 475,665

[22] Filed: Feb. 6, 1990

[30] Foreign Application Priority Data

Mar. 30, 1989 [JP] Japan .................. 1-083184

[51] Int. Cl.⁵ .................. G11C 7/00; G11C 8/00
[52] U.S. Cl. .................. 365/222; 365/230.03; 395/425; 364/DIG. 1
[58] Field of Search .................. 365/222, 230.03; 364/200 MS File, 900 MS File

[56] References Cited

U.S. PATENT DOCUMENTS

| | | | |
|---|---|---|---|
| 4,648,032 | 3/1987 | Romero, Jr. et al. | 365/222 |
| 4,649,511 | 3/1987 | Gdula | 365/222 |
| 4,701,843 | 10/1987 | Cohen | 365/222 |
| 4,706,221 | 11/1987 | Satoh et al. | 365/222 |
| 4,754,425 | 6/1988 | Bhadriraju | 365/222 |
| 4,792,891 | 12/1988 | Baba | 365/222 |
| 4,796,232 | 1/1989 | House | 365/222 |
| 4,903,197 | 2/1990 | Wallace et al. | 364/200 |
| 4,918,650 | 4/1990 | DeWolf | 365/222 |

OTHER PUBLICATIONS

Official Announcement Publn. Nippon Denki Databook Bulletin "V-Series Microprocessor/Periphery".
NEC Corporation, *V Series Microprocessor/Peripheral, Data Book, 1987*, Apr. 1, 1987, pp. 306-434.

Primary Examiner—Stuart N. Hecker
Assistant Examiner—Michael A. Whitefield
Attorney, Agent, or Firm—Townsend and Townsend

[57] ABSTRACT

A refresh control circuit for a processor which is connected to dynamic random access memory via an address bus, a data bus and control signal lines. A refresh control signal is output at predetermined intervals to refresh the dynamic random access memory. The refresh control circuit includes control circuitry and an address generator. The address generator latches a value received from the control circuitry. Based on such latched value, a refresh address is changed by the N-th power of 2, N corresponding to the number of memory banks of the dynamic random access memory.

3 Claims, 4 Drawing Sheets

REFRESH CONTROL CIRCUIT

BACKGROUND OF THE INVENTION

This invention relates to a refresh control circuit for a dynamic random access memory.

Dynamic random access memories (DRAM), which are widely used for data processing systems, store information with charges stored in their capacitance. Consequently, it is necessary to retrieve the stored information, amplify the signal level, and make recharge before discharge of the contents. This process is called "refreshing."

DRAM cells are arranged in rows and columns in the form of a matrix. All the memory cells in a row are refreshed by a single refreshing cycle. The refreshing operation requires a refresh timing signal and a refresh address signal which specifies the row to be refreshed.

A system including a processor equipped with a refresh address generator is shown in FIG. 3. This system includes a processor 10, a refresh frequency pulse generator 11, a refresh control circuit 12, a refresh address generator 13, an address bus 20, a data bus 21, a plurality of control signal lines 22, a DRAM control circuit 30, a memory timing control circuit 31, an address multiplexer 32, a memory address bus 33, and a DRAM 40.

The refresh address generator 13 is shown in more detail in FIG. 4. It includes a refresh address counter 14.

In operation, the processor 10 carries out arithmetic and logic operations and data rearrangement in memory locations of the DRAM 40 according to a program. The memory locations of the DRAM 40 are specified by the address signal on the address bus 20. The data to be transferred is transmitted in the direction specified by a signal on the control signal lines 22 at specified timing via the data bus 21. The upper portion of an address is used to determine the DRAM chip which has the desired memory location while the middle and lower portions are used to determine the row and column memory positions, respectively, in the DRAM. In general, it is necessary to output by time sharing row and column addresses on the memory address bus 33 to the DRAM 40. Consequently, the address multiplexer 32 outputs by time sharing the middle and lower portions of an address on the memory address bus 33 in synchronism with changes in the multiplex signal (MPX) from the memory timing control circuit 31.

On the other hand, the refresh frequency pulse generator 11 generates pulses at regular intervals informing the refresh control circuit 12 of the necessity of DRAM refreshing. At this point, it is necessary to provide the DRAM 40 with the row address of a memory to be refreshed. The position of a row address, which is the middle address portion on the address bus 20, varies with the type of a system depending on the memory capacity of a single DRAM. In order to make the refresh address generator 13 independent of the system, it is a common practice to not only output at the lower position of an address bus a refresh address indicative of the row position of a memory to be refreshed but also control the DRAM control circuit 30 via the control signal line 22 so that the address multiplexer 32 connects the lower address portion to the memory address bus 33 during a refreshing period. Thus, the row position of a memory to be refreshed is presented in the DRAM 40 for carrying out memory refreshing.

In order to minimize the time for the DRAM refreshing to use the bus, it is a common practice to simultaneously refresh all DRAM chips.

The address output from the refresh address generator 13, which is a value of the refresh address counter 14, is output on the address bus in response to a refresh address enable signal (RFADEN). The refresh address counter 14 is incremented by one for each refreshing cycle in response to a refresh address increment signal (RFADINC) so that when it repeats the refreshing process for the same times as the number of rows, all the memory cells of the DRAM 40 are refreshed.

Since the refresh address is output at the lower position of an address bus in the conventional refresh address generator, the following useless refreshing process is required for memory interleaving in the DRAM. Since data is read out of the DRAM a certain time after the previous one is read out, the memory interleaving has been developed to speed up the memory system.

As shown in FIG. 5, by the memory interleaving technique, addresses are divided into two banks; an odd number address bank and an even number address bank to place them on separate memory chips. That is, odd number addresses 1, 3, . . . are used for a DRAM 40a while even number addresses 2, 4, . . . are used for a DRAM 40b so that access to a continuous memory space becomes free of the above time constraint. In the 2-bank memory interleaving, the least significant bit of an address is used to designate the bank.

In order to reduce the number of refreshing cycles necessary for all the memory cells in such a DRAM 40, simultaneous selection of all the banks is made for performing refreshing. Consequently, the output of a refresh address at the least significant bit by the conventional refresh address circuit not only makes bank designation meaningless but also causes excessive refreshing, thus wasting the valuable system time.

SUMMARY OF THE INVENTION

Accordingly, it is an object of the invention to provide a refresh control circuit which is able to provide efficient DRAM refreshing in a bank configuration.

According to the invention there is provided a refresh control circuit which is provided with an address generator capable of latching a value output on the data bus from the processor and changing the value of a refresh address by the N-th power of 2, wherein N is a natural number, based on this latched value.

The above and other objects, features, and advantages of the invention will become more apparent from the following description when taken in conjunction with the accompanying drawings.

DESCRIPTION OF THE PREFERRED EMBODIMENT

Figure 1:
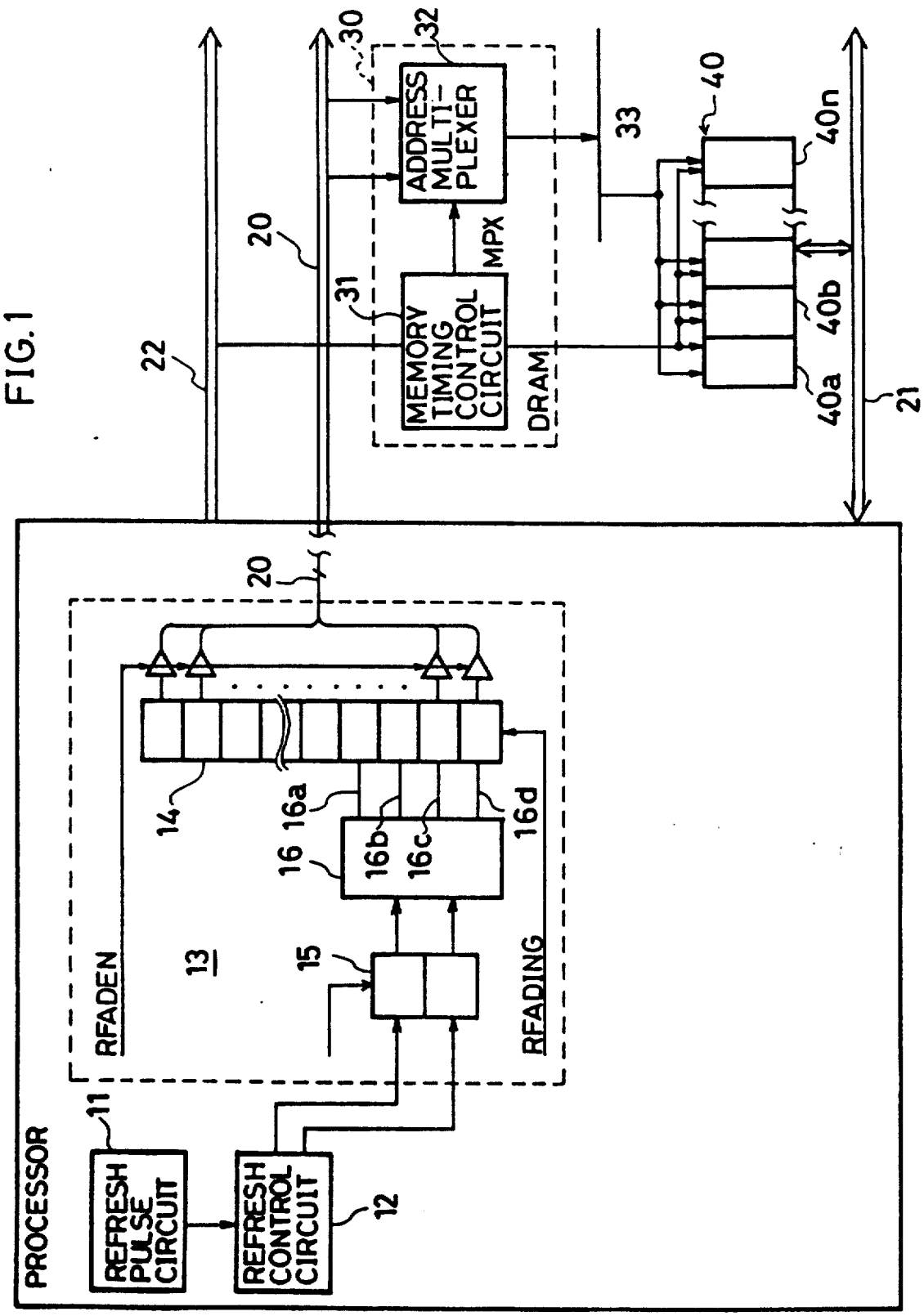
FIG. 1 is a block diagram of a refresh address generator according to an embodiment of the invention.

In FIG. 1, the refresh address generator 13 includes a refresh address counter 14, a register 15 for designating a value increased or decreased for each refreshing operation, and a decoder 16 for decoding control information from the register 15.

When the control circuit 12 outputs a signal for selecting the register 15, the register 15 stores the predetermined value. This stored value is latched until the control circuit 12 writes a new value in the register 15. In response to the value written in the register 15, the decoder 16 outputs a value of the N-th power of 2 wherein N is a natural number.

Since the register 15 has a two-bit configuration in this embodiment, there are four selectable values 00, 01, 10, and 11. The decoder 16 outputs four values 0001 ($=2^0$), 0010 ($=2^1$), 0100 ($=2^2$), and 1000 ($=2^3$) on respective signal lines 16a–16d as the lower portion of an address signal.

Figure 2:
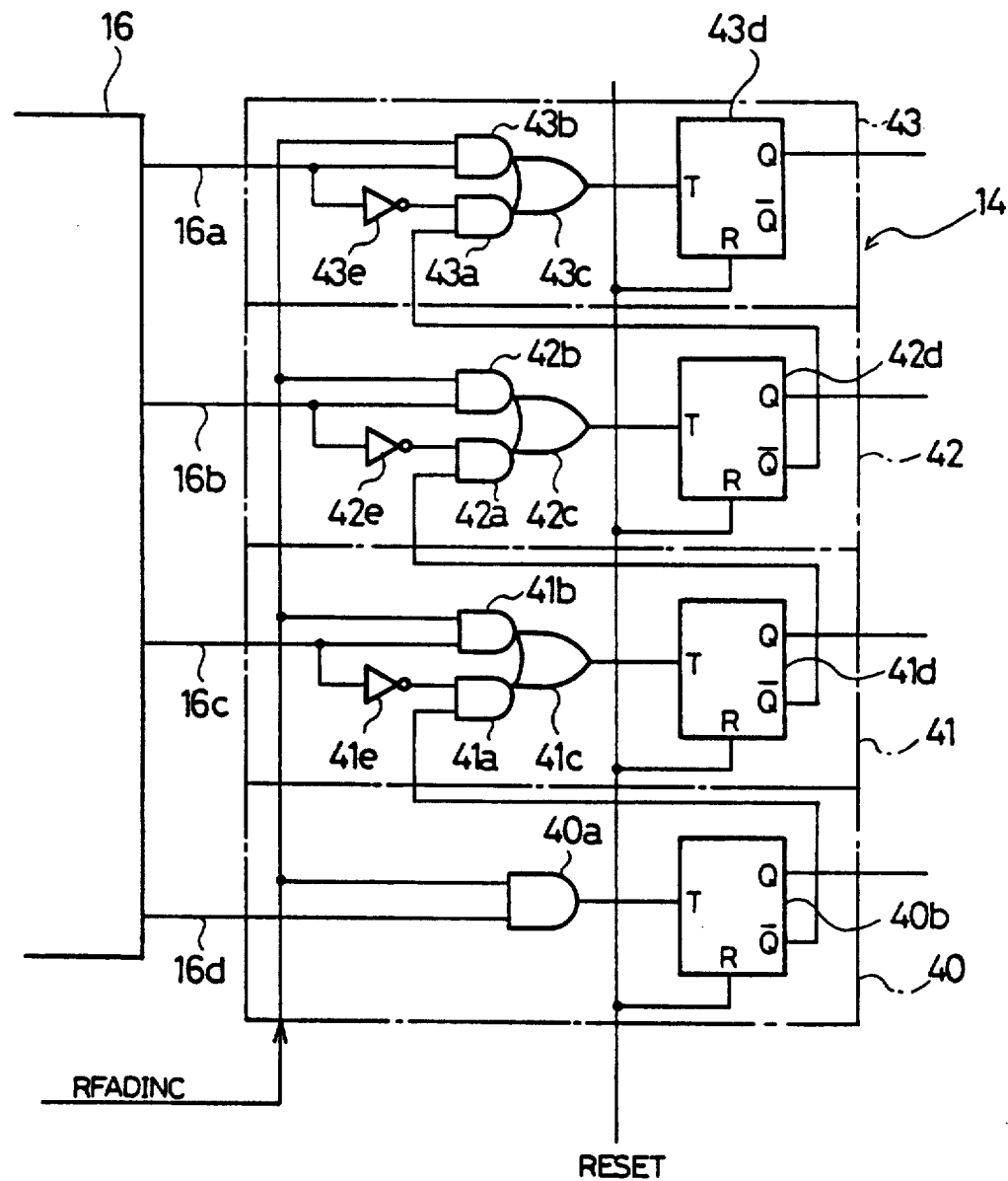
FIG. 2 is a schematic diagram of a refresh address counter useful for the refresh address generator of FIG. 1.
Figure 3:
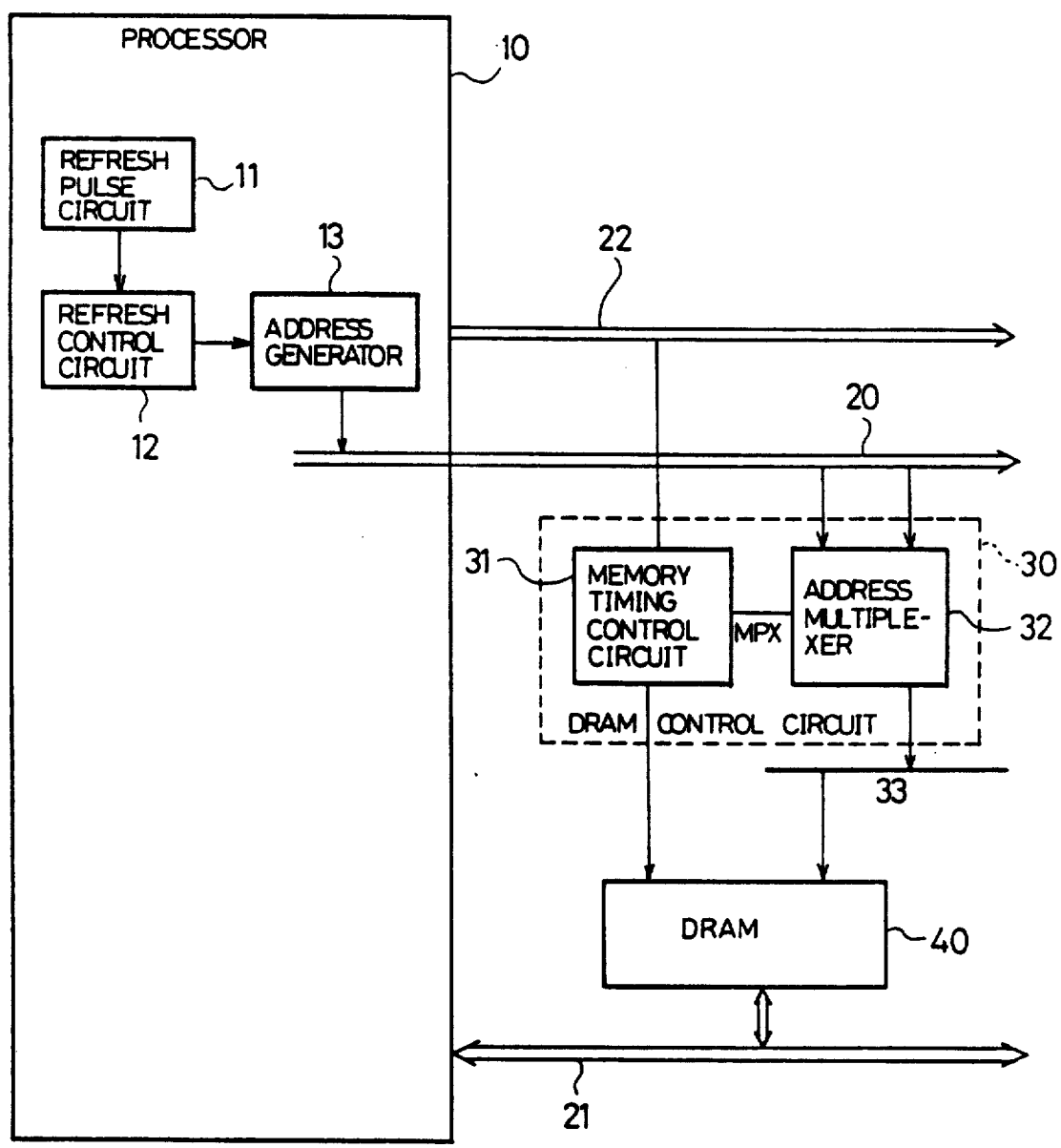
FIG. 3 is a block diagram of a conventional refresh control circuit.
Figure 4:
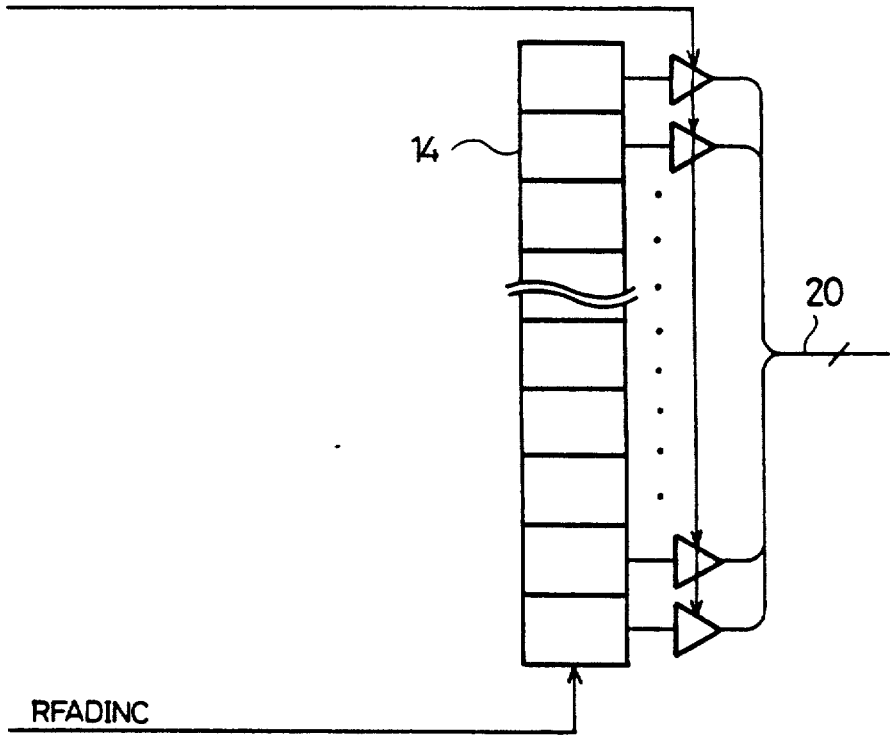
FIG. 4 is a schematic diagram of a conventional address generator.
Figure 5:
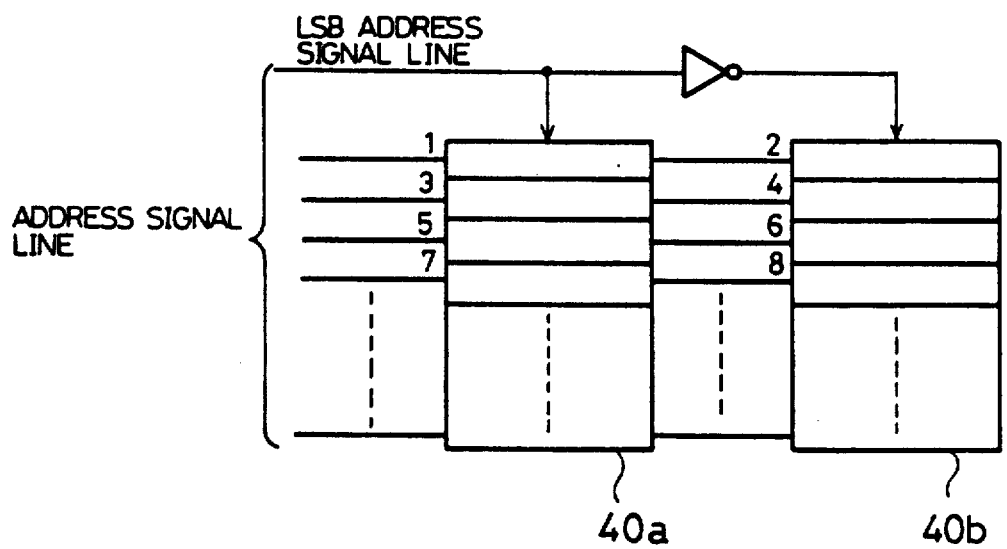
FIG. 5 is a schematic diagram of a conventional bank switch memory.

FIG. 2 shows part of the refresh address counter 14 for four bits from the least significant bit. This portion of the counter 14 consists of a $2_0$ counter 40, a $2^1$ counter 41, a $2^2$ counter 42, and a $2^3$ counter 43. The $2^0$ counter 40 consists of an AND circuit 40a which receives a RFADING signal from the processor 10 and a signal from the decoder 16 via the signal line 16d and a T flip-flop 40b which is responsive to a signal from the AND circuit 40a to establish an address. The other counters 41–43 respectively consist of an inverter 41e–43e for inverting a signal from the decoder 16 via the signal lines 16a–16c, an AND circuit 41a–43a for receiving a signal from the lower counter 40–42 and a signal from the inverter 41e–43e, an AND circuit 41b–43b for receiving the aforementioned RFADINC signal and a signal via the signal lines 16a–16c, an OR circuit 41c–43c for a signal from the AND circuit 41b–43b, and a T flip-flop 41d–43d responsive to a signal from the OR circuit 41c–43c to establish an address.

The value of a refresh address may be increased or decreased by the N-th power of 2 by using the four signal lines 16a–16d for designating the lower four bits of a refresh address and incrementing or decrementing each of the upper bits of the address via ordinary address signal lines. More specifically, when a value 0001, wherein a logic 1 and three logic O's are output on the LSB signal line 16d and the other signal lines 16a–16c, respectively, the refresh address counter 14 is incremented by $2^0=1$ with the RFADINC signal from the LSB.

When a value of 0010, wherein a logic 1 and three logic O's are output on the second signal line 16c and the other signal lines, respectively, the address is increased by $2^1=2$. Similarly, when a value of 0100, wherein a logic 1 and three logic O's are output on the third signal line 16b and the other signal lines, respectively, the address is increased by $2^2=4$. Finally, when a value of 1000, wherein a logic 1 and three logic O's are output on the fourth signal line 16a and the other signal lines, respectively, the address is increased by $2^3=8$.

As has been described above, where a memory has a bank configuration, it is possible to refresh all the memory cells of the DRAM 40 by setting N to the number of banks and repeating the refresh operation by the number of rows.

With the refresh control circuit according to the invention, the address generation circuit latches a value to be output from the processor and a value of the N-th power of 2 corresponding to the latched value is used as the lower bit of an address, it is possible to change the refresh address by the N-th power of 2. Consequently, where a DRAM system has a bank configuration wherein the lower address portion is used to switch the bank, the lower address portion is fixed and the upper portion is used for providing an effective refresh address to thereby eliminate useless refresh operation, resulting in the shortened operation time and the higher system process capability.

What is claimed:

1. A refresh circuit for controlling memory refresh operations of a dynamic random access memory having $2^N$ memory banks, comprising:
   means for periodically generating a pulse signal for triggering a refresh operation;
   means receiving said pulse signal for generating, in response to said pulse signal, a predetermined value, N, of said $2^N$ memory banks; and
   means receiving said predetermined value for generating a sequence of refresh address signals by iteratively changing a refresh address by $2^N$ during said refresh operation, each one refresh address signal of said sequence selecting a row in a respective memory bank.

2. The refresh circuit of claim 1, wherein said address generating means comprises:
   a register for latching said predetermined value;
   a counter holding said refresh address and being responsive to a count-up or count-down signal to change said refresh address by a step value; and
   a decoder receiving said predetermined value from said register to establish said step value, said step value being $2^N$.

3. The refresh circuit of claim 2, wherein said counter comprises N bit-counters, each N bit-counter generating one bit of said refresh address;
   a first counter of said N bit-counters consisting of a first AND circuit and a first flip-flop, said first AND circuit receiving said count-up or count-down signal and a lowest order bit of said step value to generate a first AND gate output, said first flip-flop receiving said first AND gate output and outputting a lowest-order bit of said refresh address;
   an i-th counter of said N bit-counters consisting of an invertor, a second AND circuit, a third AND circuit, an OR circuit and a second flip-flop, the invertor receiving said count-up or count-down signal to generate an inverted count-up or count-down signal, the second AND circuit receiving the inverted count-up or count-down signal and an output from an (i-1)th counter to generate a second AND circuit output, the third AND circuit receiving said count-up or count-down signal and an i-th-order bit of said step value to generate a third AND circuit output, the OR circuit receiving the second AND circuit output and third AND circuit output to generate an OR circuit output, the second flip-flop receiving the OR circuit output and outputting an N-th order bit of said refresh address, where $2 \leq N$, and $2 < i < N$.

* * * * *

UNITED STATES PATENT AND TRADEMARK OFFICE
CERTIFICATE OF CORRECTION

PATENT NO. : 5,089,987

DATED : February 18, 1992

INVENTOR(S) : Yuichi Nakao, et al

It is certified that error appears in the above-identified patent and that said Letters Patent is hereby corrected as shown below:

Col. 3, line 24, "20" should be --2°--.

Col. 3, line 47, 52, 56 and 59, "1" should be --1--.
Col. 3, lines 47, 53, 56 and 59 "O" should be --0--.

Col. 4, line 56, "1" should be --1--.

Col. 4, line 64, "N-th" should be --i-th--.

Col. 4, line 64, "2=N" should be --2-N--.

Col. 4, line 65, "2<i<N" should be --2≤i≤N--.

Signed and Sealed this

Seventh Day of December, 1993

*Attest:*

BRUCE LEHMAN

*Attesting Officer*     Commissioner of Patents and Trademarks